United States Patent
Zhu

(10) Patent No.: US 10,593,438 B2
(45) Date of Patent: Mar. 17, 2020

(54) SOLAR CELL FRONT SIDE SILVER PASTE DOPED WITH MODIFIED GRAPHENE AND PREPARATION METHOD THEREOF

(71) Applicant: NANTONG T-SUN NEW ENERGY CO., LTD., Nantong, Jiangsu (CN)

(72) Inventor: Peng Zhu, Nantong Jiangsu (CN)

(73) Assignee: Nantong T-Sun New Energy Co., Ltd., Nantong, Jiangsu (CN)

( * ) Notice: Subject to any disclaimer, the term of this patent is extended or adjusted under 35 U.S.C. 154(b) by 30 days.

(21) Appl. No.: 15/571,177

(22) PCT Filed: Apr. 11, 2017

(86) PCT No.: PCT/CN2017/080019
§ 371 (c)(1),
(2) Date: Nov. 1, 2017

(87) PCT Pub. No.: WO2017/198006
PCT Pub. Date: Nov. 23, 2017

(65) Prior Publication Data
US 2018/0226172 A1    Aug. 9, 2018

(30) Foreign Application Priority Data
May 16, 2016   (CN) .......................... 2016 1 0319951

(51) Int. Cl.
| | |
|---|---|
| H01B 1/16 | (2006.01) |
| H01B 1/22 | (2006.01) |
| H01B 1/24 | (2006.01) |
| H01B 1/18 | (2006.01) |
| H01L 31/0224 | (2006.01) |

(52) U.S. Cl.
CPC .............. H01B 1/16 (2013.01); H01B 1/18 (2013.01); H01B 1/22 (2013.01); H01B 1/24 (2013.01); H01L 31/022425 (2013.01)

(58) Field of Classification Search
CPC ... H01B 1/16; H01B 1/18; H01B 1/22; H01B 1/24; H01L 31/0224; H01L 31/022425
See application file for complete search history.

(56) References Cited

U.S. PATENT DOCUMENTS

| | | | |
|---|---|---|---|
| 7,763,187 B1 | 7/2010 | Veedu | |
| 2011/0247866 A1* | 10/2011 | Kim ...................... | B82Y 30/00 174/257 |
| 2014/0042375 A1* | 2/2014 | Kim ........................ | C03C 8/10 252/514 |
| 2014/0060602 A1* | 3/2014 | Aoai ..................... | B82Y 30/00 136/205 |
| 2015/0179294 A1 | 6/2015 | Kim | |
| 2017/0301804 A1* | 10/2017 | Hang ................... | B23K 35/025 |
| 2018/0056455 A1* | 3/2018 | Venkatagiriyappa .. | C08K 3/042 |

FOREIGN PATENT DOCUMENTS

| | | | |
|---|---|---|---|
| CN | 102646459 A | * | 8/2012 |
| CN | 103500597 | | 1/2014 |
| CN | 103811130 | | 5/2014 |
| CN | 104021842 A | * | 9/2014 |
| CN | 104078090 | | 10/2014 |
| CN | 104078090 A | * | 10/2014 |
| CN | 104217783 | | 12/2014 |
| CN | 104464883 | | 3/2015 |
| CN | 104987672 A | * | 10/2015 |
| CN | 105845198 | | 8/2016 |

OTHER PUBLICATIONS

English machine translation of Tan et al. "CN 104078090 A" provided via the EPO. 2019. All Pages. (Year: 2019).*
English machine translation of CN 104078090 A provided by the EPO. (Year: 2019).*
English machine translation of CN 102646459 A provided by the EPO. (Year: 2019).*
Gelest, "Coupling Agents", https://www.gelest.com/applications/coupling-agents/, All Pages. (Year: 2017).*
English machine translation of Meng et al. (CN 104021842 A) provided via the EPO. (Year: 2019).*
English machine translation of Xu et al. (CN-104987672-A) provided by the EPO. (Year: 2019).*
International Search Report filed in PCT/CN2017/080019 dated May 31, 2017.

* cited by examiner

*Primary Examiner* — Daniel P Malley, Jr.
(74) *Attorney, Agent, or Firm* — Rankin, Hill & Clark LLP

(57) ABSTRACT

A solar cell front side silver paste doped with modified graphene and its preparation method are disclosed. The solar cell front side silver paste doped with modified graphene comprises by weight 0.1-5 parts of modified graphene, 88-91 parts of silver powder, 5-15 parts of organic binder, 1-5 parts of organic solvent, 1-3 parts of glass powder, wherein the modified graphene is a surface modified graphene. A solar cell front side silver paste is developed, which is screen printed on a crystalline silicon wafer, sintered at a high temperature, penetrates the SiNx passivation layer in the crystalline silicon wafer, and thus forms a good ohmic contact.

5 Claims, No Drawings

SOLAR CELL FRONT SIDE SILVER PASTE DOPED WITH MODIFIED GRAPHENE AND PREPARATION METHOD THEREOF

FIELD OF THE INVENTION

The invention relates to a solar cell front side silver paste, and more particularly, to a solar cell front side silver paste doped with modified graphene and its preparation method.

BACKGROUND OF THE INVENTION

At present, improving the efficiency of solar cells is the goal pursued by the highly competitive photovoltaic industry. Main commercial methods to improve the efficiency of solar cells are the shallow junction method and the dense gate method. That is to say, raising the diffusion sheet resistivity and increasing the quantity of printed gate electrodes are used to improve the efficiency of solar cells.

In order to extract photo-induced current produced in a crystalline silicon solar cell to the external load, it is necessary to a make metal electrode respectively on the two sides of a silicon P-N junction and to set up a metal connection. Therefore, fabricating electrodes is a very important for solar cells.

The electrodes on the surface of silicon solar cells are mainly the back side electrode and the front side silver electrode. These electrodes are usually printed on the surface of silicon wafers by the use of conductive silver pastes.

A front side silver paste is printed by high resolution screen printing to form gate lines with a good height to width ratio, so as to reduce the shading area on the surface of the solar cell, and reduce the series resistance inside the solar cell and the internal power dissipation of the photo-induced current, and eventually, to effectively improve the photo-electric conversion efficiency of the solar cell, Thus, there is an increasingly high demand on the printability of the front side silver paste.

In addition, the front side silver paste has the ability to penetrate the SiNx antireflective film. Forming good ohmic contact with the silicon wafer after being sintering is a key factor to improve the efficiency of solar cells.

Generally, reducing the gate line width and raising gate line height to width ratio are the current topics under more research and development. The printed line array has already arrived at the bottleneck stage. In the meantime, there is very few domestic researches on the additives used for silver pastes.

Therefore, in the invention by the use of graphene which has a two-dimensional planar structure, high electrical conductivity and thermal conductivity, the ohmic contact performance between the paste and the silicon substrate is improved, the series resistance of the paste is reduced, and the photoelectric conversion efficiency of solar cells is improved.

SUMMARY OF THE INVENTION

The object of the invention: the present invention is to provide a front side silver paste doped with modified graphene for solar cells. The front side silver paste is characterized in that by doping modified graphene, the contact resistance between the silver paste and the silicon substrate, and the gate line resistance are reduced, and thus the efficiency of solar cells is improved.

Technical Scheme: A solar cell front side silver paste doped with modified graphene, comprising by weight: 0.1-5 parts of modified graphene, 88-91 parts of silver powder, 5-15 parts of organic binder, 1-5 parts of organic solvent, 1-3 parts of glass powder, wherein the modified graphene is a surface modified graphene.

Preferably, the surface modified graphene comprises graphene and surface modifier, wherein the surface modified graphene comprises 85-99 parts by weight of graphene and 1-15 parts by weight of surface modifier.

Preferably, the surface modifier is one or more members of the group consisting of titanate coupling agent, aluminate coupling agent, silane coupling agent and zircoaluminate coupling agent.

Preferably, the silver powder is composed of 85-99 parts of micron-sized spherical silver powder and 1-15 parts of nano-sized silver powder, wherein the average particle size of the micron-sized spherical silver powder is 1.0-2.0 µm, and the average particle size of the nano-sized silver powder is 20-100 nm.

Preferably, the organic binder is composed of 10-20 parts by weight of polymer and 80-90 parts by weight of organic solvent, wherein the polymer is one or more members of the group consisting of ethyl cellulose, acrylic resin and polyethylene resin, and the organic solvent is two or more members of the group consisting of butyl carbitol, terpineol, tributyl citrate and propylene glycol butyl ether.

Preferably, the glass powder comprises 1-10 parts by weight of $B_2O_3$, 0-5 parts by weight of $Cr_2O_3$, 20-60 parts by weight of PbO, 0-5 parts by weight of $SiO_2$, 50-80 parts by weight of $TeO_2$ and 0-20 parts by weight of $Bi_2O_3$; the glass powder is processed to give glass binder with a particle size D50 of 0.5-2 µM; the melting point of glass powder is controlled within 250-450° C.

The invention also discloses a method for preparing a solar cell front side silver paste doped with modified graphene, including the following steps:

(1) Preparation of modified graphene: 85-99 parts by weight of graphene and 1-15 parts by weight of surface modifier are weighed and mixed, and the mixture is ultrasonically dispersed with an ultrasonic dispersion machine for 20-60 min, filtered, and dried to give the modified graphene;

(2) Preparation of an organic binder: 10-20 parts by weight of polymer and 80-90 parts by weight of organic solvent are weighed and mixed, and the mixture is dispersed with a dispersion machine for 50-70 min to dissolve the polymer, and then a transparent and homogeneous organic binder is obtained;

(3) Preparation of a glass powder: 1-10 parts by weight of $B_2O_3$, 0-5 parts by weight of $Cr_2O_3$, 20-60 parts by weight of PbO, 0-5 parts by weight of $SiO_2$, 50-80 parts by weight of $TeO_2$ and 0-20 parts by weight of $Bi_2O_3$ are weighed and well mixed, and the mixture is heated in a high temperature muffle furnace at 800-1200° C. for 40-60 min, quenched with deionized water after being melted, ball-milled for 2.5-10 h, sieved with a 300 mesh screen, and a glass powder with a particle size D50 less than 2 µm is obtained;

(4) Preparation of a solar cell front side silver paste: 0.1-5 parts by weight of modified graphene, 5-15 parts by weight of organic binder and 1-3 parts by weight of glass powder are weighed and mixed, and then dispersed with a dispersion machine at the speed of 500-800 rpm for 10-30 min; 88-91 parts by weight of silver powder is added, and the mixture is dispersed with a dispersion machine at the speed of 800-1000 rpm for 30-50 min, the mixture is grinded with a three-roller grinding machine 15 times, followed by the addition of 1-3 parts by weight of organic solvent, which is composed of two or more members of the group consisting of butyl carbitol, terpineol, tributyl citrate and propylene glycol butyl ether, the mixture is dispersed with a high speed dispersion machine for 5-20 min, and a finished paste is obtained and packed for further use.

The paste obtained as above, which is doped with modified graphene, can be used as a solar cell front side silver paste. The solar cell front side silver paste is screen printed with a 360 mesh screen on a 125 mm×125 mm monocrystalline silicon wafer to form an electrode film, and then the printed monocrystalline silicon wafer is sintered in a muffle furnace, the sintering peak temperature being 780° C.

Beneficial Effects: In the invention, because of addition of modified graphene, the contact resistance of crystalline silicon solar cells is obviously reduced. The contact resistance of the crystalline silicon solar cells can be 0.0018 Ω.

In the invention mainly aimed at the application in solar cells, a solar cell front side silver paste is developed, which is screen printed on a crystalline silicon wafer, sintered at a high temperature, penetrates the SiNx passivation layer in the crystalline silicon wafer, and thus forms a good ohmic contact. The contact resistance between silver and silicon and the line resistance are reduced, and the photoelectric conversion efficiency is improved. Thus, the market prospects of the front side silver paste of the invention will be broad.

DETAILED DESCRIPTION OF THE PREFERRED EMBODIMENTS

The present invention is described in detail with some embodiments.

Embodiment 1

A solar cell front side silver paste doped with modified graphene comprises by weight: 0.1 part of modified graphene, 88 parts of silver powder, 5 parts of organic binder, 2 parts of organic solvent and 1 part of glass powder, wherein the modified graphene is a surface modified graphene.

The surface modified graphene comprises graphene and surface modifier, and particularly, the surface modified graphene comprises 85 parts by weight of graphene and 1 part by weight of surface modifier.

The surface modifier used is one or more member of the group consisting of titanate coupling agent, aluminate coupling agent, silane coupling agent, zircoaluminate coupling agent or their mixture.

The silver powder is composed of 85 parts by weight of micron-sized spherical silver powder with an average particle size of 1.0 μm and 1 part of nano-sized silver powder with an average particle size of 20 nm.

The organic binder is composed of 10 parts by weight of polymer and 80 parts by weight of organic solvent, wherein the polymer is one or more members of the group consisting of ethyl cellulose, acrylic resin and polyethylene resin, and the organic solvent is two or more members of the group consisting of butyl carbitol, terpineol, tributyl citrate and propylene glycol butyl ether.

The glass powder comprises 1 part by weight of $B_2O_3$, 20 parts by weight of PbO and 50 parts by weight of $TeO_2$; the glass powder is processed to give glass binder with a particle size D50 of 0.5 μm.

The method for preparing a solar cell front side silver paste doped with modified graphene includes the following steps:

(1) Preparation of modified graphene: 85 parts by weight of graphene and 1 part by weight of surface modifier are weighed and mixed, and the mixture is ultrasonically dispersed with an ultrasonic dispersion machine for 20 min, filtered, and dried to give a modified graphene;

(2) Preparation of an organic binder: 10 parts by weight of polymer and 80 parts by weight of organic solvent are weighed and mixed, and the mixture is dispersed with a dispersion machine for 50 min to dissolve the polymer, and then a transparent and homogeneous organic binder;

(3) Preparation of a glass powder: 1 part by weight of $B_2O_3$, 20 parts by weight of PbO and 50 parts by weight of $TeO_2$ are weighed and well mixed, and the mixture is heated in a high temperature muffle furnace at 800° C. for 40 min, quenched with deionized water after being melted, ball-milled for 2.5 h, sieved with a 300 mesh screen, and a glass powder with a particle size D50 less than 2 μm is obtained;

(4) Preparation of a solar cell front side silver paste: 0.1 part by weight of modified graphene, 5 parts by weight of organic binder and 1 part by weight of glass powder are weighed and mixed, and then dispersed with a dispersion machine at the speed of 500 rpm for 10 min; 88 parts by weight of silver powder is added, and the mixture is dispersed with at dispersion machine at the speed of 800 rpm for 30 min, the mixture is grinded with a three-roller grinding machine 15 times, followed by addition of 1 part by weight of organic solvent, which is composed of two or more members of the group consisting of butyl carbitol, terpineol, tributyl citrate and propylene glycol butyl ether, the mixture is dispersed with a high speed dispersion machine for 5 min, and a finished product, the solar cell front side silver paste doped with modified graphene, is obtained and packed for further use.

The paste obtained as above is screen printed with a 360 mesh screen on a 125mm×125mm monocrystalline silicon wafer to form an electrode film, and then the printed monocrystalline silicon wafer is sintered in a muffle furnace, the sintering peak temperature being 780° C.

Embodiment 2

A solar cell front side silver paste doped with modified graphene comprises by weight: 5 parts of modified graphene, 91 parts of silver powder, 15 parts of organic binder, 2 parts of organic solvent and 3 parts of glass powder, wherein the modified graphene is a surface modified graphene.

The surface modified graphene comprises 99 parts by weight of graphene and 15 parts by weight of surface modifier.

The surface modifier used is one or more member of the group consisting of titanate coupling agent, aluminate coupling agent, silane coupling agent, zircoaluminate coupling agent or their mixture.

The silver powder is composed of 99 parts by weight of micron-sized spherical silver powder with an average particle size of 2.0 μm and 15 part of nano-sized silver powder with an average particle size of 100 nm.

The organic binder is composed of 20 parts by weight of polymer and 90 parts by weight of organic solvent, wherein the polymer is one or more members of the group consisting of ethyl cellulose, acrylic resin and polyethylene resin, and the organic solvent is two or more members of the group consisting of butyl carbitol, terpineol, tributyl citrate and propylene glycol butyl ether.

The glass powder comprises 10 parts by weight of $B_2O_3$, 5 parts by weight of $Cr_2O_3$, 60 parts by weight of PbO, 5 parts by weight of $SiO_2$, 80 parts by weight of $TeO_2$ and 20 parts by weight of $Bi_2O_3$; the glass powder is processed to give glass binder with a particle size D50 of 2 μm. The melting point of the glass powder is controlled to be about 450° C.

The method for preparing a solar cell front side silver paste doped with modified graphene includes the following steps:

(1) Preparation of modified graphene: 99 parts by weight of graphene and 15 part by weight of surface modifier are weighed and mixed, and the mixture is ultrasonically dispersed with an ultrasonic dispersion machine for 60 min, filtered, and dried to give a modified graphene;

(2) Preparation of an organic binder: 20 parts by weight of polymer and 90 parts by weight of organic solvent are weighed and mixed, and the mixture is dispersed with a dispersion machine for 70 min to dissolve the polymer, and then a transparent and homogeneous organic binder;

(3) Preparation of a glass powder: 10 parts by weight of $B_2O_3$, 5 parts by weight of $Cr_2O_3$, 60 parts by weight of PbO, 5 parts by weight of $SiO_2$, 80 parts by weight of $TeO_2$ and 20 parts by weight of $Bi_2O_3$ are weighed and well mixed, and the mixture is heated in a high temperature muffle furnace at 1200° C. for 60 min, quenched with deionized water after being melted, ball-milled for 10 h, sieved with a 300 mesh screen, and a glass powder with a particle size D50 less than 2 μm is obtained; the melting point of the glass powder is controlled to be about 250° C.

(4) Preparation of a solar cell front side silver paste: 5 parts by weight of modified graphene, 15 parts by weight of organic binder and 3 part by weight of glass powder are weighed and mixed, and then dispersed with a dispersion machine at the speed of 800 rpm for 30 min; 91 parts by weight of silver powder is added, and the mixture is dispersed with at dispersion machine at the speed of 1000 rpm for 50 min, the mixture is grinded with a three-roller grinding machine 15 times, followed by addition of 3 part by weight of organic solvent, which is composed of two or more members of the group consisting of butyl carbitol, terpineol, tributyl citrate and propylene glycol butyl ether, the mixture is dispersed with a high speed dispersion machine for 20 min, and a finished product, the solar cell front side silver paste doped with modified graphene, is obtained and packed for further use.

The paste obtained as above is screen printed with a 360 mesh screen on a 125mm×125mm monocrystalline silicon wafer to form an electrode film, and then the printed monocrystalline silicon wafer is sintered in a muffle furnace, the sintering peak temperature being 780° C.

Embodiment 3

A solar cell front side silver paste doped with modified graphene comprises by weight: 3 parts of modified graphene, 89 parts of silver powder, 10 parts of organic binder, 3 parts of organic solvent and 2 parts of glass powder, wherein the modified graphene is a surface modified graphene.

The surface modified graphene comprises 90 parts by weight of graphene and 7 parts by weight of surface modifier.

The surface modifier used is one or more member of the group consisting of titanate coupling agent, aluminate coupling agent, silane coupling agent, zircoaluminate coupling agent or their mixture.

The silver powder is composed of 87 parts by weight of micron-sized spherical silver powder with an average particle size of 1.4 μm and 7 parts of nano-sized silver powder with an average particle size of 70 nm.

The organic binder is composed of 15 parts by weight of polymer and 85 parts by weight of organic solvent, wherein the polymer is one or more members of the group consisting of ethyl cellulose, acrylic resin and polyethylene resin, and the organic solvent is two or more members of the group consisting of butyl carbitol, terpineol, tributyl citrate and propylene glycol butyl ether.

The glass powder comprises 6 parts by weight of $B_2O_3$, 3 parts by weight of $Cr_2O_3$, 40 parts by weight of PbO, 3 parts by weight of $SiO_2$, 60 parts by weight of $TeO_2$ and 10 parts by weight of $Bi_2O_3$; the glass powder is processed to give glass binder with a particle size D50 of 1 μm; the melting point of the glass powder is controlled to be around 350° C.

The method for preparing a solar cell front side silver paste doped with modified graphene includes the following steps:

(1) Preparation of modified graphene: 90 parts by weight of graphene and 7 part by weight of surface modifier are weighed and mixed, and the mixture is ultrasonically dispersed with an ultrasonic dispersion machine for 40 min, filtered, and dried to give the modified graphene;

(2) Preparation of an organic binder: 15 parts by weight of polymer and 85 parts by weight of organic solvent are weighed and mixed, and the mixture is dispersed with a dispersion machine for 60 min to dissolve the polymer, and then a transparent and homogeneous organic binder;

(3) Preparation of a glass powder: 6 parts by weight of $B_2O_3$, 3 parts by weight of $Cr_2O_3$, 40 parts by weight of PbO, 3 parts by weight of $SiO_2$, 60 parts by weight of $TeO_2$ and 10 parts by weight of $Bi_2O_3$ are weighed and well mixed, and the mixture is heated in a high temperature muffle furnace at 1100° C. for 50 min, quenched with deionized water after being melted, ball-milled for 6 h, sieved with a 300 mesh screen, and a glass powder with a particle size D50 less than 2 μm is obtained;

(4) Preparation of a solar cell front side silver paste: 3 parts by weight of modified graphene, 10 parts by weight of organic binder and 2 parts by weight of glass powder are weighed and mixed, and then dispersed with at dispersion machine at the speed of 700 rpm for 20 min; 89 parts by weight of silver powder is added, and the mixture is dispersed with at dispersion machine at the speed of 900 rpm for 40 min, the mixture is grinded with a three-roller grinding machine 15 times, followed by the addition of 2 part by weight of organic solvent, which is composed of two or more members of the group consisting of butyl carbitol, terpineol, tributyl citrate and propylene glycol butyl ether, the mixture is dispersed with a high speed dispersion machine for 12 min, and a finished product, the solar cell front side silver paste doped with modified graphene, is obtained and packed for further use.

The paste obtained as above is screen printed with a 360 mesh screen on a 125mm×125mm monocrystalline silicon wafer to form an electrode film, and then the printed monocrystalline silicon wafer is sintered in a muffle furnace, the sintering peak temperature being 780° C.

The invention is not limited to the above preferred embodiments. Various other products made with the identical or similar technologies disclosed in the invention by persons skilled in the art who are enlightened from the invention, no matter any modifications or changes in shape or structure, are within the scope of the invention.

I claim:

1. A solar cell front side silver paste doped with modified graphene, comprising:
  0.1-5 parts by weight of modified graphene,
  88-91 parts by weight of silver powder,
  5-15 parts by weight of organic binder,
  1-5 parts by weight of a first organic solvent, and
  1-3 parts by weight of glass powder, wherein the surface modified graphene is graphene with a surface modified by one or more surface modifiers selected from the group consisting of aluminate coupling agent, and zircoaluminate coupling agent; and wherein the surface modified graphene comprises 85-99 parts by weight of graphene and 1-15 parts by weight of the one or more surface modifiers.

2. A solar cell front side silver paste doped with modified graphene according to claim 1, wherein the silver powder is composed of 85-99 parts of micron-sized spherical silver powder and 1-15 parts of nano-sized silver powder, wherein the average particle size of the micron-sized spherical silver powder is 1.0-2.0 µm, and the average particle size of the nano-sized silver powder is 20-100 nm.

3. A solar cell front side silver paste doped with modified graphene according to claim 1, wherein the organic binder is composed of 10-20 parts by weight of polymer and 80-90 parts by weight of a second organic solvent, and wherein the polymer is one or more members of the group consisting of ethyl cellulose, acrylic resin and polyethylene resin, and the organic solvent is two or more members of the group consisting of butyl carbitol, terpineol, tributyl citrate and propylene glycol butyl ether.

4. A solar cell front side silver paste doped with modified graphene according to claim 1, wherein the glass powder comprises 1-10 parts by weight of $B_2O_3$, 0-5 parts by weight of $Cr_2O_3$, 20-60 parts by weight of PbO, 0-5 parts by weight of $SiO_2$, 50-80 parts by weight of $TeO_2$ and 0-20 parts by weight of $Bi_2O_3$;

wherein the glass powder has a particle size D50 of 0.5-2 µm; and wherein a melting point of the glass powder is 250-450° C.

5. The solar cell front side silver paste doped with modified graphene according to claim 1, wherein the graphene has a two-dimensional planar structure.

* * * * *